United States Patent
Kou (10) Patent No.: US 6,530,517 B1
(45) Date of Patent: Mar. 11, 2003

(54) COMPONENT FEEDER IDENTIFICATION AND MONITORING AND COMPONENT INVENTORY TRACKING

(75) Inventor: Yuen-Foo Michael Kou, Melrose, MA (US)

(73) Assignee: Accu-Assembly, Inc., Woburn, WA (US)

( * ) Notice: Subject to any disclaimer, the term of this patent is extended or adjusted under 35 U.S.C. 154(b) by 0 days.

(21) Appl. No.: 09/409,788

(22) Filed: Sep. 30, 1999

Related U.S. Application Data (63) Continuation of application No. 08/926,848, filed on Sep. 10, 1997, now Pat. No. 6,027,019.

(51) Int. Cl.$^7$ .............................................. G06K 17/00
(52) U.S. Cl. .................... 235/375; 235/486; 235/494; 29/709; 29/740
(58) Field of Search .............................. 235/375, 383, 235/486, 494, 385; 29/709, 719, 760, 832

(56) References Cited

U.S. PATENT DOCUMENTS

| | | | |
|---|---|---|---|
| 4,175,654 A | | 11/1979 | Lodge |
| 5,155,888 A | | 10/1992 | Lau |
| 5,157,617 A | * | 10/1992 | Ramsey ...................... 364/478 |
| 5,283,943 A | | 2/1994 | Aguayo et al. |
| 5,455,409 A | * | 10/1995 | Smith et al. ................. 235/385 |
| 5,515,600 A | * | 5/1996 | Iwasaki et al. ................ 29/740 |
| 5,553,376 A | * | 9/1996 | Solanki et al. ................ 29/833 |
| 5,557,834 A | * | 9/1996 | Miyanaka et al. ........ 29/407.05 |
| 5,567,927 A | | 10/1996 | Kahn et al. |
| 5,659,440 A | | 8/1997 | Acosta et al. |
| 5,713,125 A | * | 2/1998 | Watanabe et al. .............. 29/833 |
| 5,838,574 A | * | 11/1998 | Olson et al. ............ 364/478.07 |
| 5,844,593 A | * | 12/1998 | Proffitt et al. ................ 347/262 |
| 5,980,086 A | * | 11/1999 | Kanematsu et al. .... 364/468.07 |
| 6,027,019 A | * | 2/2000 | Kou ........................... 235/375 |
| 6,031,242 A | | 2/2000 | Hudson |
| 6,045,654 A | | 4/2000 | Johnson |

FOREIGN PATENT DOCUMENTS

| | | |
|---|---|---|
| EP | 0 476 577 A | 3/1992 |
| JP | 6-6076 | 1/1994 |
| JP | 6-6077 | 1/1994 |
| JP | 6-6098 | 1/1994 |

OTHER PUBLICATIONS

Supplemental European Search Report for European Appln. No. 98 94 3520 (1 pp) dated May 16, 2001.

\* cited by examiner

*Primary Examiner*—Thien M. Le
*Assistant Examiner*—Daniel St. Cyr
(74) *Attorney, Agent, or Firm*—Fish & Richardson, P.C.

(57) ABSTRACT

A system and method for monitoring the configuration of component feeders in a placement machine having a series of feeder slots for holding the component feeders. The system includes slot markers for installation on the placement machine to correspond to the feeder slots, feeder markers for installation on the component feeders of the placement machine, and a marker detector (e.g., a bar code scanner) adapted to monitor the arrangement of slot markers and feeder markers in the machine while the machine is in operation.

16 Claims, 7 Drawing Sheets

FIG. 9

COMPONENT FEEDER IDENTIFICATION AND MONITORING AND COMPONENT INVENTORY TRACKING

This application is a continuation of U.S. application Ser. No. 08/926,848, filed Sep. 10, 1997 now U.S. Pat. No. 6,027,019.

BACKGROUND OF THE INVENTION

This invention relates to monitoring the configuration of component feeders on a component placement machine.

Component placement is one of the most labor and data intensive operations in electronic board assembly. Current high speed component placement equipment can place up to 10,000 to 30,000 components per hour, depending on configuration, and can carry up to 1,000,000 or more individual components.

Surface mount components are typically supplied by component vendors as rolled tapes of components that must be loaded onto individual feeders, sometimes called component dispensing cartridges, that can then be mounted in corresponding feeder slots on the machine. These rolls of components (up to, in some cases, 10,000 or more components per roll) may be loaded onto the feeders either at a stock room or at the machine, and the loaded feeders then loaded into feeder slots.

Component placement machines can have many feeder slots (e.g., 150 or more), each accessible by a placement turret or other picking mechanism that picks individual components from the feeders in the slots and places them in particular locations on a printed circuit board, according to programmed instructions. For application flexibility, each feeder and slot is generally constructed to be compatible with many different components.

The physical arrangement of components, feeders and slots must be in accordance with the expected arrangement as programmed in the machine. Any error in the arrangement can cause a corresponding error in the placement of components on the board. In a high volume, low mix manufacturing environment, a component loading error can produce a high number of defective printed circuit boards in a short period of time. In a low volume, high mix environment the chance of component loading error increases because of frequent feeder manipulation for product change over.

To help eliminate loading errors, some have suggested placing bar code labels on individual feeders and slots and then scanning the feeder and slot labels with a hand-held scanner as the feeders are placed in the slots (i.e., before the machine begins its operation).

SUMMARY OF THE INVENTION

The invention features a system for guarding against some of the typical loading errors that can occur even with the most conscientious machine operators, as well as providing much-needed inventory and maintenance data.

According to one aspect of the invention, a apparatus for monitoring the configuration of component feeders is provided, for use in a placement machine having a series of feeder slots for holding the component feeders. The apparatus includes slot markers for installation on the placement machine to correspond to the feeder slots, feeder markers for installation on the component feeders of the placement machine, and a marker detector adapted to monitor the arrangement of slot markers and feeder markers in the machine while the machine is in operation.

The slot markers and feeder markers may be light-scannable labels, the marker detector including a scanner arranged to scan the slot markers and feeder markers.

Preferably, the marker detector is arranged to substantially simultaneously scan the slot marker of a given slot and the feeder marker of the feeder in (i.e., installed in) the given slot. The apparatus can be triggered to scan a given slot marker and corresponding feeder marker by the machine as the machine picks a component from the slot corresponding to the given slot marker. By "substantially simultaneously" we mean within the same pick cycle.

The marker detector, in some embodiments, is adapted to compare the arrangement of slot markers and feeder markers to stored data while the machine is placing components. The apparatus preferably also includes means to alert an operator (e.g., an audible or visible alarm) upon detection of an undesirable arrangement of slot markers and feeder markers.

The apparatus may be adapted to work with different types of placement machines. For example, for use with a placement machine that includes a moving picking mechanism and a stationary feeder platform, the scanner is preferably constructed to be attached to the moving picking mechanism of the placement machine. For use with a placement machine that includes a rotatable picking mechanism, a moving feeder platform and a stationary portion, the scanner is preferably constructed to be attached to the stationary portion of the placement machine.

The apparatus includes, in preferred embodiments, a data storage device adapted to store component feeder configuration data. The data storage device may be adapted to record the number of components remaining in each component feeder, and/or to track the number of times a given component feeder has been accessed by the placement machine.

The apparatus may also be adapted for use with multiple placement machines. In such configurations, the apparatus should include a data link between the multiple placement machines and the data storage device, preferably such that the data storage device may be constructed to update component feeder information from the multiplicity of placement machines.

The apparatus may be configured for use with component reels with light-scannable labels, also including a loading scanner adapted to scan the reel labels and feeder labels as the reels are mounted upon the feeders to identify which component is loaded on a given feeder.

The apparatus is particularly well suited for use in placement machines for mounting electronic components on circuit boards. Such machines generally have a series of feeder slots for holding component feeders, and a picking device constructed to pick components from the feeder slots for mounting to a circuit board.

According to another aspect of the invention, a package of electronic components includes a housing adapted to be inserted into a component feeder of a placement machine, a multiplicity of electronic components contained within the housing and arranged to be sequentially picked from the package by the placement machine, and a removable label affixed to the package. The removable label has an adhesive backing for remounting the label, after removal from the package, on a component feeder, and light-scannable information printed thereon for identifying the components of the package. Preferably, the package has a multiplicity of such removable labels, for multiple remountings of the package on different feeders.

According to another aspect of the invention, a method for monitoring the configuration of component feeders in a placement machine having a series of feeder slots for holding the component feeders is provided. The method includes scanning, while the machine is in process of picking a component from a given feeder slot, a slot marker corresponding to the given slot and a feeder marker corresponding to the component feeder in the given slot. The method also includes comparing configuration information gathered by the scanning with stored information to check for configuration errors.

Preferably, the steps of scanning and comparing are performed while the machine is placing components.

In some embodiments, the method also includes alerting an operator upon detection of an undesirable arrangement of slot markers and feeder markers.

Prior to the operation of the placement machine, the method may also include installing component reels in feeders, scanning reel labels and feeder labels of their associated feeders to identify which components are loaded on which feeders, and mounting the loaded feeders on the placement machine.

The invention can reduce the chance of component loading error by continuously checking the arrangement of component feeders on a placement machine and alerting the operator before a mistaken component is placed. Advantageously, the system does not require the machine to sit idle while component arrangement is checked. In addition, the invention can provide accurate component inventory information and track individual feeder use for maintenance purposes. The basic components of the system are readily installed on conventional placement machines.

Other features and advantages will also be apparent from the following description and drawings.

DESCRIPTION OF THE PREFERRED EMBODIMENTS

Figure 1:
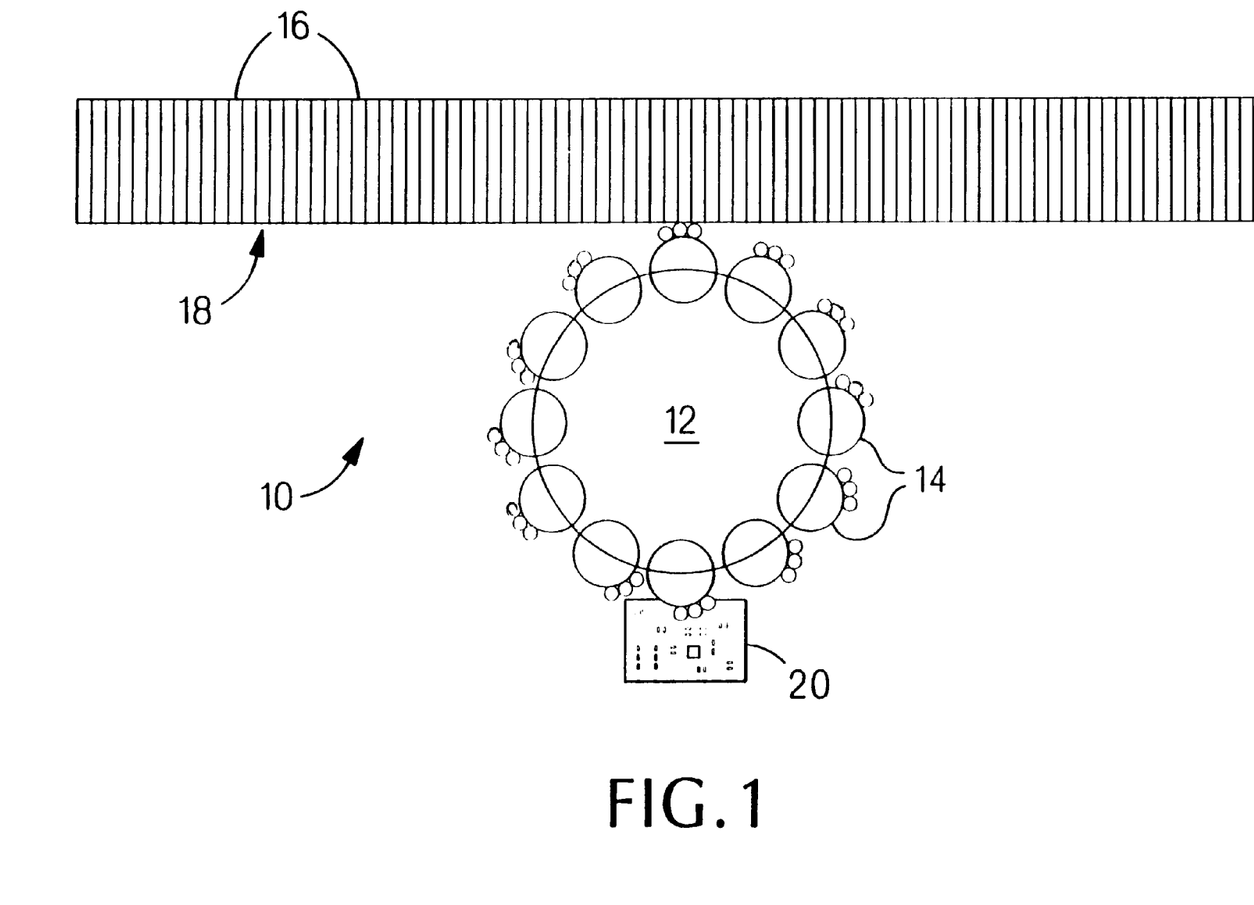
FIG. 1 is a schematic illustration of a first type of component placement machine.

FIG. 1 illustrates the basic components of a component placement machine 10 for mounting electronic components (e.g., surface mount components) on printed circuit boards and the like. In the configuration illustrated, a rotatable turret 12 has several pick-place mechanisms 14 located about its periphery. Each pick mechanism 14 is configured to pick individual components from selected feeders 16 mounted on a movable feeder platform 18 on one side of turret 12 and to place the picked components in predetermined positions on a printed circuit board 20 on the other side of the turret. Feeder platform 18 moves back and forth (along the feeder platform) to present the desired feeder 16 to pick/place mechanisms 14, and can typically hold between about 70 and 150 feeders.

Figure 2:
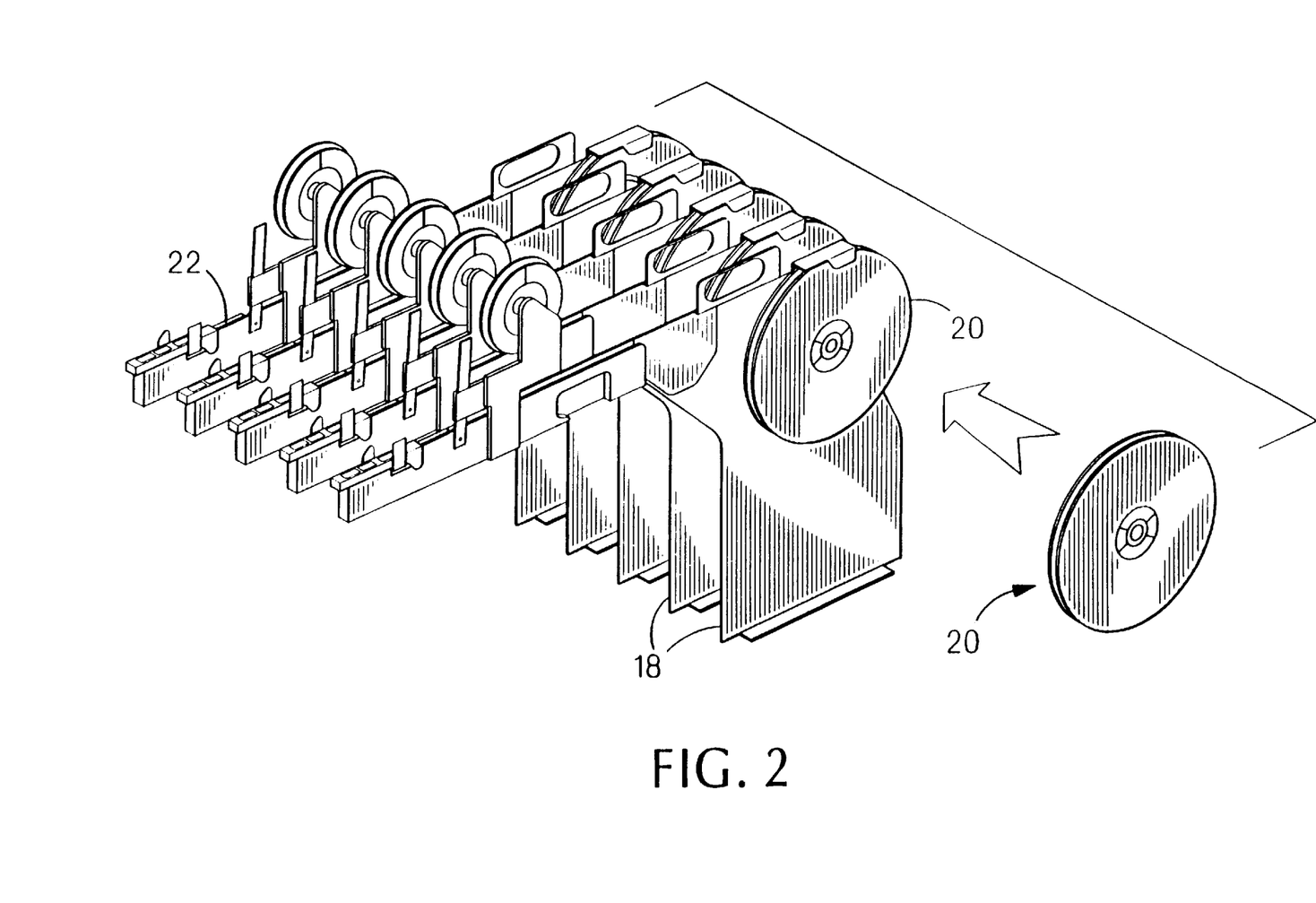
FIG. 2 illustrates loading a component feeder.

Before mounting feeders 16 in their respective slots on feeder platform 18, they are loaded with reels 20 of components as illustrated in FIG. 2. Each feeder is designed to accept several different types of components for assembling a wide range of circuits and products. The loaded feeders 16 are then mounted in slots according to an arrangement prescribed by a placement program which is loaded into the placement machine controller. The placement program contains, among other things, a prescribed association between machine slot numbers and component part numbers.

In accordance with the invention, each feeder 18 has an associated bar code label 22 affixed to an exposed surface near the dispensing tip of the feeder. Label 22 contains sufficient information to identify the individual feeder. As the feeder is loaded with a particular component reel, which may be done with spare feeders in a stock room away from the machine to avoid excessive down time, the operator inputs the loading information of the feeder. In other words, the operator associates in the data base of the monitoring system the identification and quantity of the loaded component with the particular feeder upon which it is loaded. This data input is conveniently performed with a hand-held bar code scanner for reading labels 22 and scannable component identification labels (not shown) provided on reels 20 by the component suppliers. The Electronic Industries Association (EIA) has established a standard format for bar coding such reel labels, in which the bar code graphic indicates, in order, the customer part number, the supplier part number, and the component quantity. Preferably, the EIA standard reel labels are scanned only once and a unique reel label is then assigned to each reel to keep track of the quantity of components on each individual reel in cases where the original reel identification label does not include a reel-specific identification number. When the loaded reels 20 are brought to machine 10 for loading into slots of the feeder platform 18 (FIG. 1), the machine controller prompts the operator to place a given component part number in a given slot based upon information provided in the placement program. The operator determines, typically by looking at the reel identification labels on reels 20, which feeder 18 contains the requested component and loads the feeder into the indicated slot.

Figure 3:
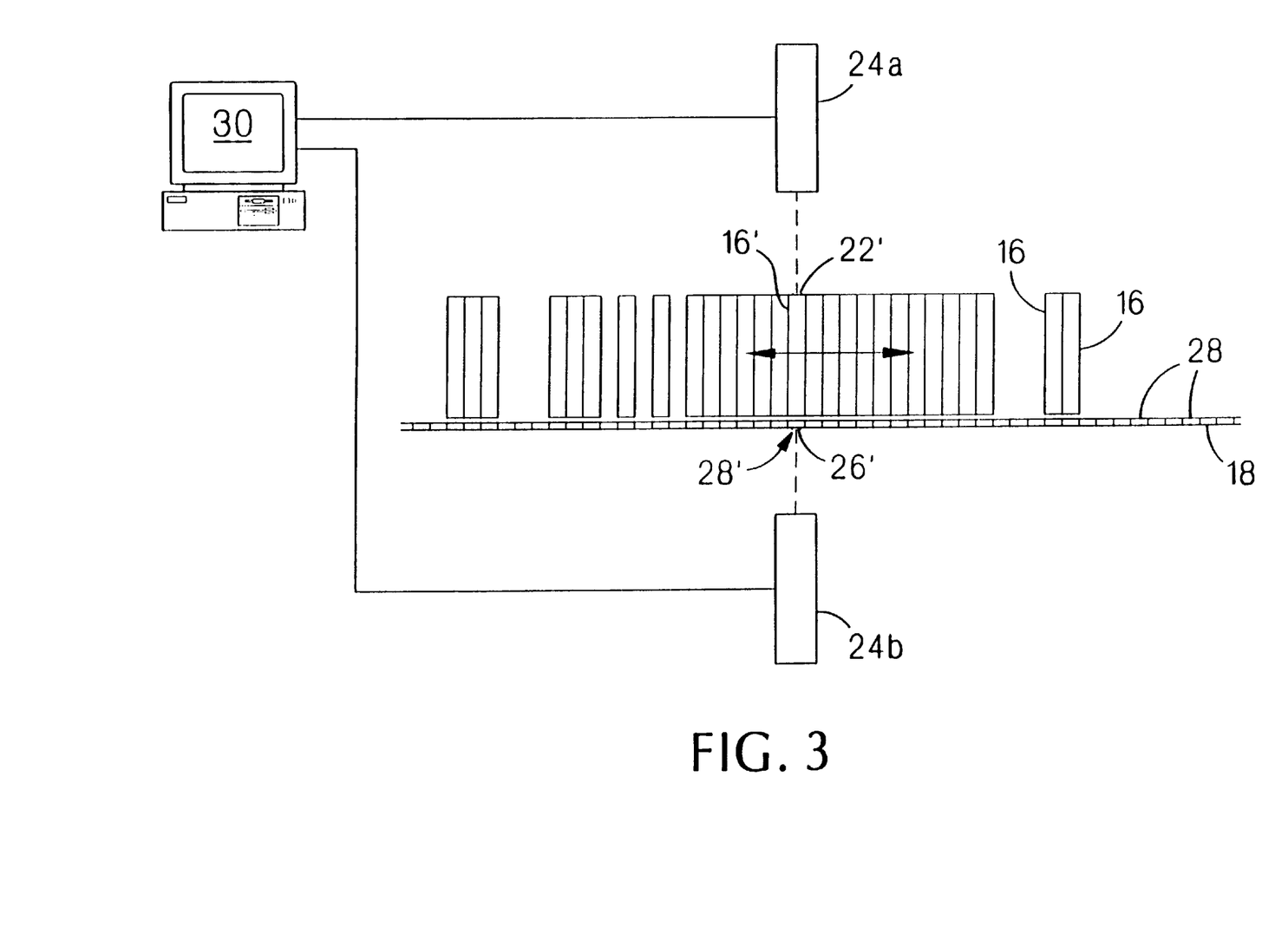
FIG. 3 is a schematic illustration of a feeder configuration monitoring system according to the invention.

Referring to FIG. 3, the monitoring system of the invention includes, in this embodiment, a feeder bar code label scanner 24a and a slot bar code label scanner 24b. Feeder platform 18 has a series of slot bar code labels 26 affixed to its exposed lower surface in association with respective slots 28 of the platform. Both scanners are mounted on the stationary portion of the placement machine, such that feeder platform 18 moves back and forth with respect to them to present specific feeders to the pick/place mechanisms. Thus, the scanners do not move with respect to the pick location. Scanner 24a is arranged to scan the label 22' of the feeder 16' aligned at the pick location, and scanner 24b is arranged to scan the slot label 26' of the slot 28' in which the aligned feeder 16' is mounted.

Figure 4:
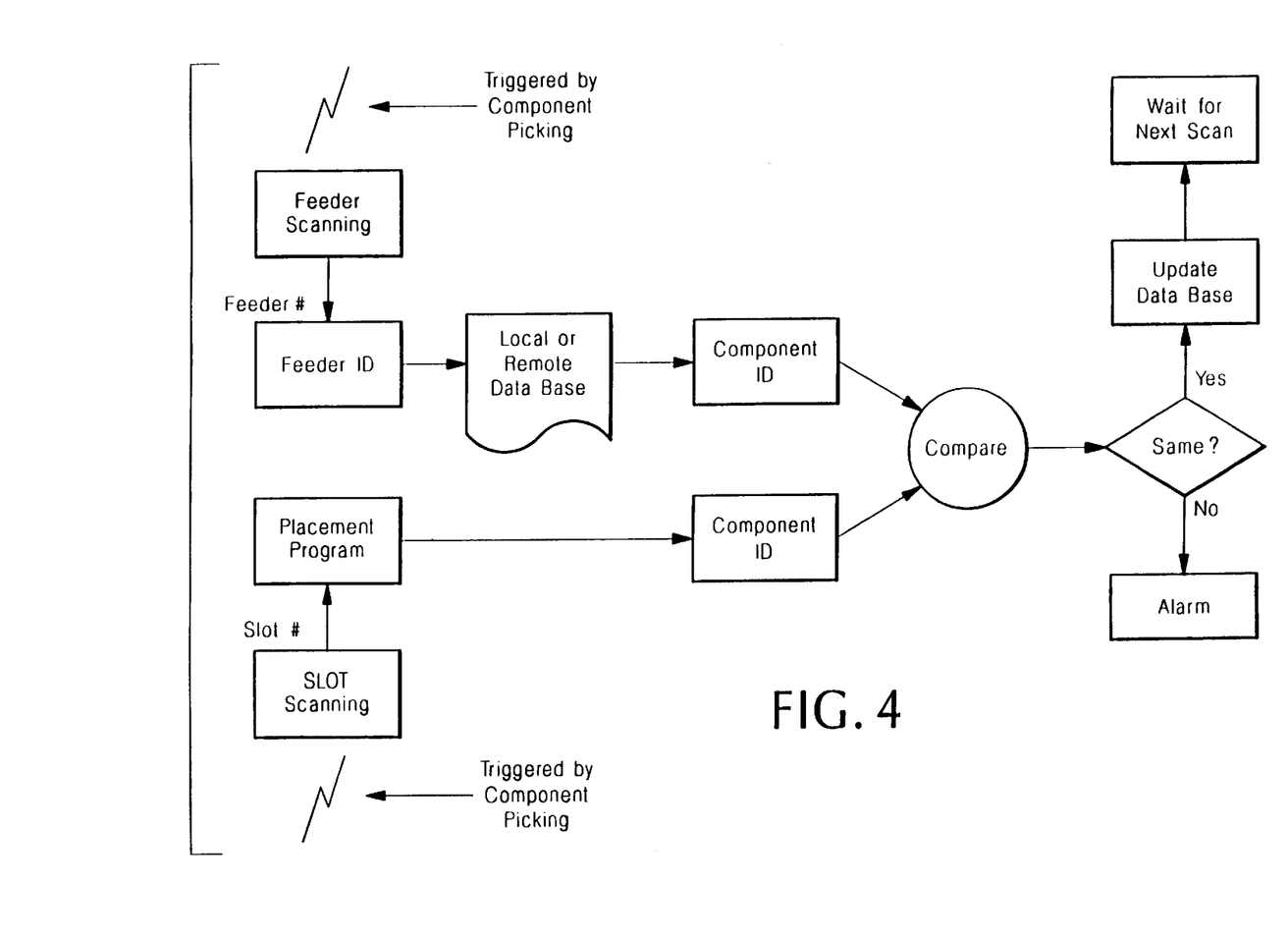
FIG. 4 is a flow diagram of the basic operation of the system of FIG. 3.

With reference also to the flow chart of FIG. 4, when triggered by the picking of a component, scanner 24a scans label 22' to determine the identification of feeder 16'. The picked component is identified by the association between feeder and component reel that was previously input into the system database when the feeder was loaded. Meanwhile, scanner 24b scans slot label 26' to determine the slot number.

Referring to information provided by the placement program, the monitoring system determines the component number that is supposed to be loaded at slot 28'. This component identification is compared to the component identification determined by the scanning of feeder label 22' by scanner 24a. If the identifications do not match, an alarm sounds. Thus the system continuously monitors the arrangement of feeders 16 to detect errors in feeder platform loading. If the identification numbers are the same (i.e., the feeder number and slot number indicate the same component identification) then the database is updated and the process repeats upon the next pick. The updating of the database includes decrementing the recorded quantity of components on feeder 16' for inventory control and updating the recorded number of times a particular feeder has been accessed (or picked from) for feeder maintenance purposes. If packaging constraints permit, a single bar code scanner may be employed to scan both the feeder and slot labels.

The computational steps and alarms indicated on FIG. 4 are effected by a personal computer 30 (FIG. 3) running software designed for this purpose. The computer may be connected to the placement machine controller via RS232 or ethernet connection. Other hardware for implementing the monitoring system on a single conventional placement machine includes the scanners 24a and 24b and an additional hand-held scanner (not shown) for inputting the feeder loading information as the feeders are loaded with component reels.

Figure 5:
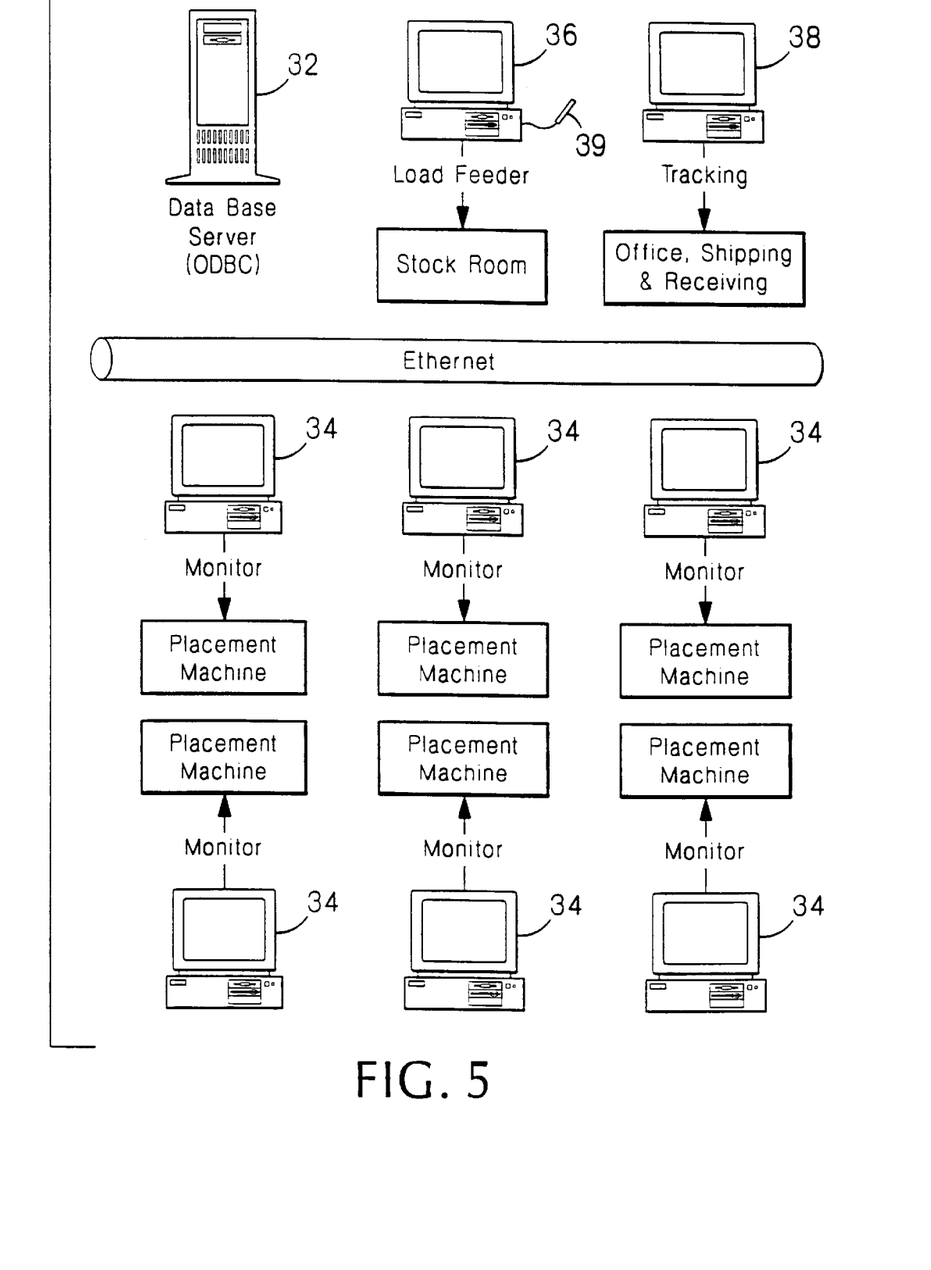
FIG. 5 illustrates a system with several machine monitors and a common database.

In a multi-machine system illustrated in FIG. 5, the database is managed by a central server 32 connected to individual machine monitoring systems 34 by an ethernet connection. Also connected for access to the database are a loading station 36 and a tracking station 38. Loading station 36 includes a hand-held bar code scanner 39 for inputting feeder loading information as component reels are loaded onto feeders for use on the various machines. Tracking station 38 contains software for accessing database information to track the status of feeders and loaded inventory. Having a common database simplifies the tasks of job supervision and inventory management.

Figure 6:
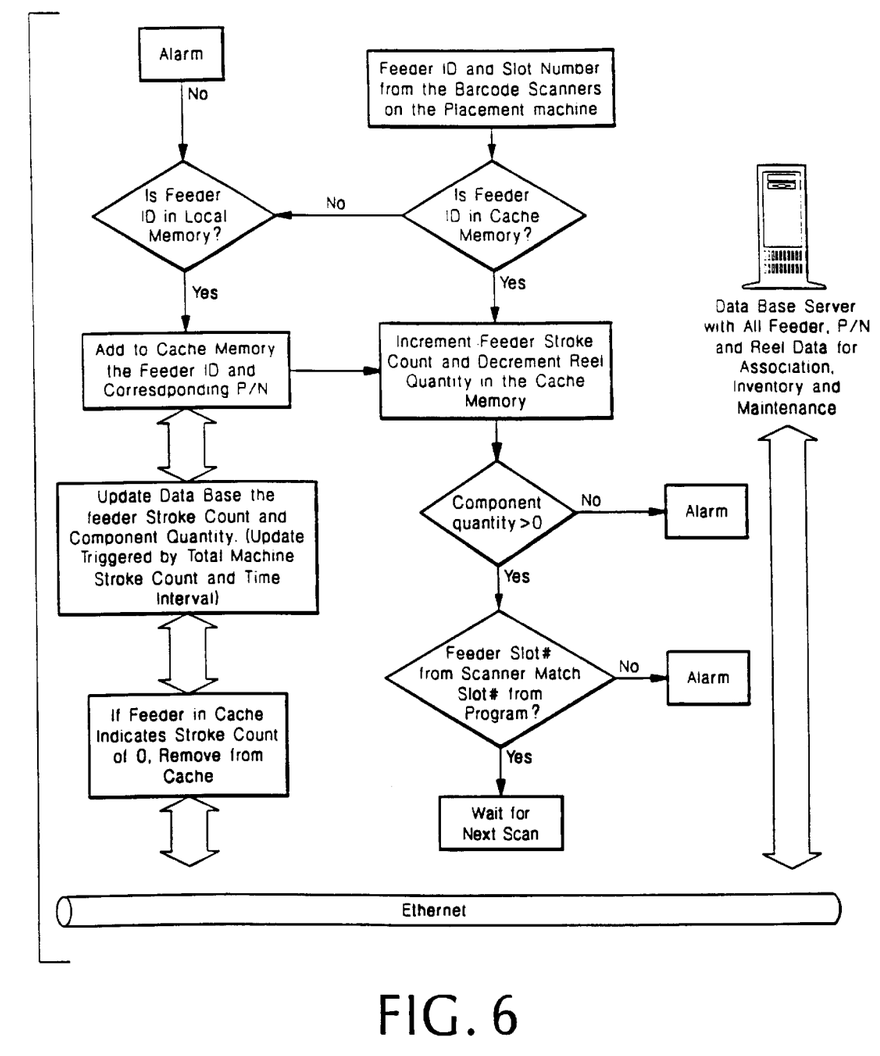
FIG. 6 is a flow diagram partially detailing the memory management of one of the machine monitors in the system of FIG. 5.

Accessing a common database shared by several machines each picking up to 30,000 components per hour can, however, require special considerations. FIG. 6, for instance, illustrates how cache memory management can be employed at each monitoring system for use with extremely fast placement machines and a common database. Before running the placement machine, the monitor system queries the database for all feeder numbers associated with each of the component numbers listed in the placement program and stores this list of feeder IDs in local memory along with the quantity of components known to remain in the feeder (the reel or component quantity). Cache memory is initially empty.

During each pick cycle, the monitor system scans the feeder label (for feeder ID) and slot label (for slot number) at the pick location. If the scanned feeder ID is not found in cache memory, the system looks for the feeder ID in local memory. If not in either memory location, an alarm is generated. If the feeder ID is found in local memory only, the feeder ID is added to cache memory. Cache memory can be thought of as a list of the feeders known to be present on the feeder platform of the machine. Local memory is a list of all feeders the common database associates with the part numbers of the placement program. Therefore, as the machine runs, cache memory will be updated each time the monitor system identifies another feeder on the machine. After each pick, the system increments the feeder stroke count in cache memory (initially zero) and decrements the reel quantity in cache memory. Local memory is not altered once the list of feeders is initially entered from the database. If the component quantity indicates that the feeder is now empty (e.g., that the feeder was replenished without properly scanning in the replacement reel), or if an error is detected in the feeder arrangement (as explained above with reference to FIG. 4), an alarm is generated. Otherwise, the cycle is repeated. In each instance where an alarm is sounded, the monitor system also stops the operation of the placement machine via a switch in its emergency stop ("e-stop") circuit.

After a fixed number of machine strokes (pick cycles), or after a predetermined time interval, the common database is updated over the ethernet connection. This update task is programmed to be performed as a background task, such that the monitoring tasks associated with the alarms are given highest priority. The current implementation updates the database after every 2,000 picks or every 10 minutes, and these intervals are adjustable by the user. During the update, the feeder stroke count in the database is incremented by the feeder stroke count in cache memory and the cache feeder strokes are reset to zero. The component quantities associated with the feeders in the database are also updated. Coincident with each database update, the cache memory is purged of any feeders not accessed since the previous database update by clearing from cache memory all feeders with stroke counts that have not advanced from zero. This may indicate, for instance, that a feeder has been replaced.

Thus, about every ten minutes or so the common database is updated to reflect the current level of inventory on all feeders in all machines. In circumstances where a substantial portion of component inventory in a plant at any given time is in partially used reels on feeders, the monitoring system doubles as a valuable inventory management tool.

Figure 7:
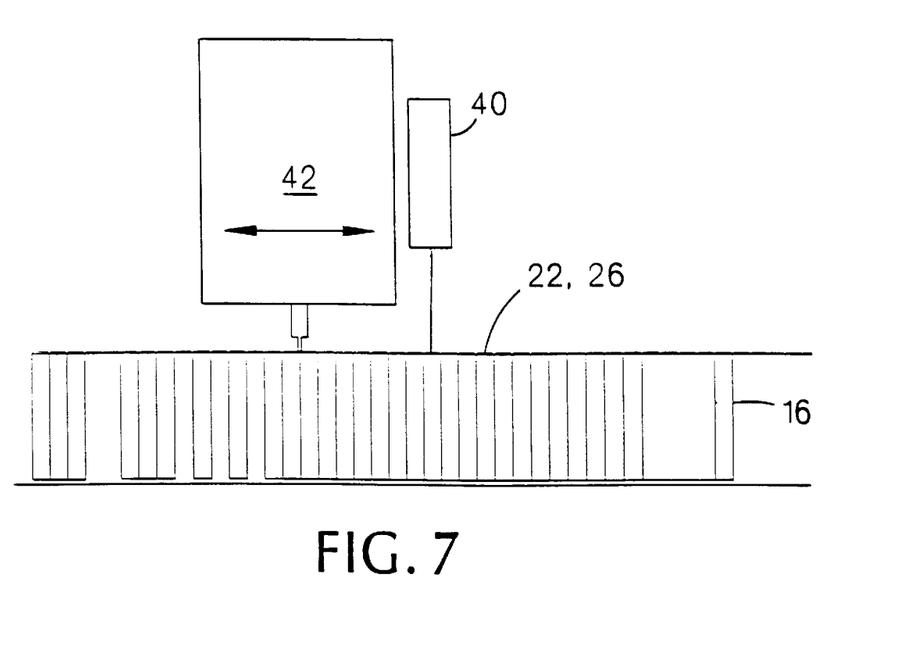
FIG. 7 is a schematic illustration of a second type of component placement machine.

The invention is also applicable for use with component placement machines in which the feeder platform remains stationary and the pick location moves, as illustrated in FIG. 7. Machines of such configuration are generally employed for mounting larger components that require very precise location, such as processors. In this embodiment, a single scanner 40 continuously scans associated pairs of slot labels and feeder labels as the translatable picking mechanism 42 moves back and forth, sending a stream of information to the monitoring system to check for errors. As there is no indication to the monitoring system of what feeder is being picked from, this particular embodiment does not monitor feeder inventory or stroke count.

Figure 8:
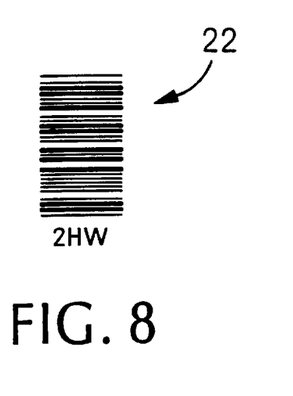
FIG. 8 is an example of a feeder bar code label.

The feeder bar code labels 22 can be made very small to fit on available exposed surfaces of standard, commercially available feeders. FIG. 8 shows an actual example of a feeder bar code label 22 developed for a first implementation of the monitoring system. The feeder identification number consists, in this example, of a three-digit alphanumeric sequence. To help avoid confusion between similar characters, a preferred set of alphanumeric characters consists of the numbers 0–9 and the letters A–Z without the letters O, Q, D, G, I, J, U or Z. The resulting character set allows for over 22,000 unique combinations, sufficient to accommodate the number of individual feeders in use at most manufacturing plants.

It is preferred that the feeder bar code labels 22 be placed on the feeders as near as possible to the location of the feeder mount (i.e., the most secure and stable portion of the feeder), in order to avoid issues related to vibrations induced in the feeder by rapid feeder platform accelerations.

Figure 9:
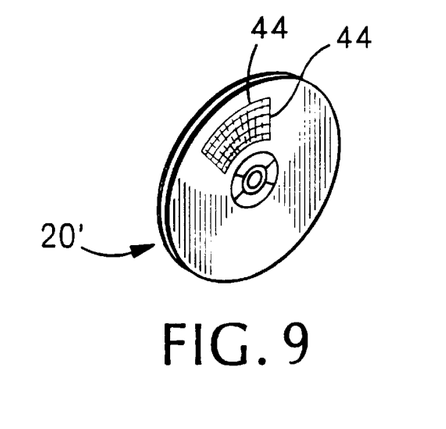
FIG. 9 shows a component reel with removable labels.

Referring to FIG. 9, in another embodiment the component reels 20' are supplied with duplicate, removable component bar code labels 44 of EIA standard format. Labels 44 have an adhesive backing such that they may be applied to the feeder upon which reel 20' is mounted, adjacent the feeder bar code label. This configuration eliminates the need to enter feeder loading information, as the monitor system can be adapted to directly read component identification information simultaneously with feeder identification. Each time a reel is mounted to a feeder, another label 44 is removed and affixed to the feeder, either over the label of the previously installed reel or after removing the old label. Enough labels 44 are provided on reel 20' to accommodate a reasonable number of remountings.

Other embodiments and advantages also fall within the scope of the following claims.

What is claimed is:

1. A method of tracking a status of a set of component feeders used in one or more component placement machines, the method comprising providing each individual feeder with associated feeder identification;

storing feeder status information in a data storage device;

mounting a plurality of the feeders on at least one placement machine;

reading the identification of the mounted feeders;

accessing the plurality of mounted feeders a number of times to pick components therefrom; and updating the stored status information of each of the plurality of feeders in the data storage device to track use of the plurality of mounted feeders while the machine continues to access the feeders to pick components.

2. The method of claim 1 wherein the stored status information includes a stroke count for each feeder, the step of updating comprising incrementing the stroke count for each mounted feeder according to the number of times the feeder has been accessed.

3. The method of claim 2 wherein the step of updating includes updating a feeder stroke count in cache memory in response to each feeder access; and then, after a predetermined interval, incrementing the feeder stroke count in the data storage device by the feeder stroke count in cache memory and resetting the feeder stroke count in cache memory to zero.

4. The method of claim 1 including using the stored status information to track individual feeder use for maintenance purposes.

5. The method of claim 1 wherein the associated feeder identification of each feeder is indicated on a feeder label affixed to an exposed surface of the feeder.

6. The method of claim 5 wherein said feeder label is a scannable bar code label.

7. The method of claim 1 wherein the data storage device is connected to a multiplicity of placement machines through a data link, the method including updating feeder information from the multiplicity of placement machines.

8. The method of claim 7 wherein the feeder status information is included in a database shared by several placement machines.

9. A method of tracking inventory of individual components in multiple component feeders used in one or more component placement machines, the method comprising providing each individual feeder with an associated feeder identification;

storing feeder status information regarding the feeders in a data storage device, the feeder status information including identification and number of components loaded onto each feeder by feeder identification;

mounting at least some of the feeders on at least one placement machine;

reading the identification of the mounted feeders;

accessing the mounted feeders a number of times to pick components therefrom; and updating the number of components indicated in the stored feeder status information for each accessed feeder to track component inventory while the machine continues to access the feeders to pick components.

10. The method of claim 9 wherein the associated feeder identification of each feeder is indicated on a feeder label affixed to an exposed surface of the feeder.

11. The method of claim 10 wherein said feeder label is a scannable bar code label.

12. The method of claim 9 wherein the data storage device is connected to a multiplicity of placement machines through a data link, the method including updating inventory information from feeders on the multiplicity of placement machines.

13. The method of claim 12 wherein the feeder status information is included in a database shared by several placement machines.

14. A system for tracking a status of a set of component feeders used in one or more component placement machines, the system comprising a set of feeder identifications, each identification associated with a corresponding individual feeder;

a reader for reading the identification of multiple feeders mounted on a placement machine;

a pick counter for tracking a number of times individual components are picked from each mounted feeder; and a data storage device for storing feeder status information concerning the multiple mounted feeders, the data storage device configured to receive data from the pick counter to update the stored feeder status information to track use of the multiple mounted feeders while the machine continues to pick components from the feeders.

15. A system for tracking inventory of individual components in component feeders mounted on one or more component placement machines, the system comprising a set of feeder identifications, each identification associated with a corresponding individual feeder;

a reader for reading the identification of multiple feeders mounted on a placement machine;

a pick counter for tracking a number of times individual components are picked from each mounted feeder; and a data storage device for storing feeder status information including identification and number of components loaded onto each feeder by feeder identification, the data storage device configured to receive data from the pick counter to update the stored number of components associated with each of the multiple mounted feeders to track component inventory while the machine continues to pick components from the feeders.

16. The system of claim 15 further comprising a data link between multiple placement machines and the data storage device.

* * * * *

UNITED STATES PATENT AND TRADEMARK OFFICE
CERTIFICATE OF CORRECTION

PATENT NO.      : 6,530,517 B1
DATED           : March 11, 2003
INVENTOR(S)     : Yuen-Foo Michael Kou It is certified that error appears in the above-identified patent and that said Letters Patent is hereby corrected as shown below:

<u>Title page,</u>
Item [56], References Cited, U.S. PATENT DOCUMENTS, "6,045,654" should be -- 6,045,653 --.

Signed and Sealed this

Thirtieth Day of September, 2003

JAMES E. ROGAN
*Director of the United States Patent and Trademark Office*